US009298082B2

(12) United States Patent
Li et al.

(10) Patent No.: US 9,298,082 B2
(45) Date of Patent: Mar. 29, 2016

(54) MASK PLATE, EXPOSURE METHOD THEREOF AND LIQUID CRYSTAL DISPLAY PANEL INCLUDING THE SAME

(71) Applicant: SHENZHEN CHINA STAR OPTOELECTRONICS TECHNOLOGY CO., LTD., Shenzhen, Guangdong (CN)

(72) Inventors: Meng Li, Shenzhen (CN); Jinjie Wang, Shenzhen (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 14/241,820

(22) PCT Filed: Jan. 21, 2014

(86) PCT No.: PCT/CN2014/071013
§ 371 (c)(1),
(2) Date: Feb. 27, 2014

(87) PCT Pub. No.: WO2015/096249
PCT Pub. Date: Jul. 2, 2015

(65) Prior Publication Data
US 2015/0177610 A1 Jun. 25, 2015

(30) Foreign Application Priority Data

Dec. 25, 2013 (CN) .......................... 2013 1 0728529

(51) Int. Cl.
*G03F 1/38* (2012.01)
*G02F 1/1335* (2006.01)
(Continued)

(52) U.S. Cl.
CPC ................ *G03F 1/38* (2013.01); *G02F 1/1368* (2013.01); *G02F 1/13439* (2013.01); *G02F 1/133514* (2013.01); *G02F 1/133516* (2013.01); *G03F 7/0007* (2013.01)

(58) Field of Classification Search
CPC ... G03F 7/0007; G03F 1/38; G02F 1/133514; G02F 1/1368; G02F 1/38
USPC .......................................... 430/5, 7; 349/106
See application file for complete search history.

(56) References Cited

U.S. PATENT DOCUMENTS

| 7,042,549 B1 | 5/2006 | Ren et al. ...................... 349/200 |
| 2002/0044239 A1* | 4/2002 | Koyama ........................ 349/110 |

FOREIGN PATENT DOCUMENTS

| CN | 1818758 A | 8/2006 |
| CN | 101369095 A | 2/2009 |

(Continued)

OTHER PUBLICATIONS

Computer-generated translation of JP 2000-267253 (Sep. 2000).*
(Continued)

*Primary Examiner* — John A McPherson
(74) *Attorney, Agent, or Firm* — Stein IP, LLC

(57) ABSTRACT

The present disclosure relates to a mask plate, an exposure method thereof, and a liquid crystal display panel including the mask plate. On the mask plate, a plurality of pattern regions is arranged in a gradient variation from the center of the mask plate to the edges thereof according to the deformation degree of the exposure mask. The method for exposing the mask plate comprises the following steps of, (a) providing an exposure mask in a horizontal state, and measuring the deformation degree of the exposure mask; (b) arranging, on the mask plate, a plurality of pattern regions, the dimensions of which change in a gradient manner from the center of the mask plate to the edges thereof according to the deformation degree of the exposure mask; and (c) completing the exposure of the mask plate. The mask plate according to the present disclosure can compensate the effect of deformation of the exposure mask on the exposure area of the mask plate.

7 Claims, 2 Drawing Sheets

(51) Int. Cl.
*G02F 1/1368* (2006.01)
*G03F 7/00* (2006.01)
*G02F 1/1343* (2006.01)

(56) References Cited

FOREIGN PATENT DOCUMENTS

| CN | 202735676 U | * | 2/2013 |
| JP | 2000-267253 A | * | 9/2000 |
| JP | 2009-276717 A |   | 11/2009 |
| KR | 2003-0020506 A | * | 3/2003 |

OTHER PUBLICATIONS

Computer-generated translation of KR 2003-0020506 (Mar. 2003).*
International Search Report dated Aug. 11, 2014, issued to International Application No. PCT/CN2014/071013.

* cited by examiner

MASK PLATE, EXPOSURE METHOD THEREOF AND LIQUID CRYSTAL DISPLAY PANEL INCLUDING THE SAME

FIELD OF THE INVENTION

The present disclosure relates to the field of liquid crystal display, in particular to a mask plate. The present disclosure further relates to a method for exposing the mask plate. The present disclosure further relates to a liquid crystal display panel including the mask plate.

BACKGROUND OF THE INVENTION

With the development of display technology, display devices with large dimensions, high quality, and low cost become a tendency. Color filter is one of the key components of a display device (such as a TFT-LCD display device), and its quality directly determines the display effect of the display device.

The most critical step in the process of manufacturing TFT-LCD is to expose an array substrate and a color filter plate. Patterns are generated in the product within predetermined regions according to the actual size of a photomask used by a platform of the exposure machine.

Under ideal conditions, patterns with the same design on each part of a glass substrate should have the same dimension after exposure. The dimensions are equal to a design value of the photomask. In order to keep the characteristics of the components identical, the designs for all patterns on the display area of a TFT-LCD panel are usually the same. However, in an actual exposure process, considering the mounting manner of the photomask on the platform of the exposure machine, certain degree of bending deformation of the photomask due to its own gravity might occur. The larger the dimension of the photomask is, the higher the deformation degree. Compared with the perfect condition of no bending deformation in the photomask, the photomask deformation will result in differences between the optical length of exposure from the center of the photomask to the glass substrate and the optical length of exposure from the periphery of the photomask to the glass substrate. This will further lead to different exposure intensities among different parts of the glass substrates corresponding to the different parts of the photomask, thus finally causing the dimensions of the patterns on the glass substrate to be different from each other.

For example, with a horizontal direction as a reference direction, when the center of the photomask concaves downwardly (i.e., the photomask is deformed as a concave mirror), the exposure area of the part corresponding to the center of the photomask will become small, and the exposure area of the parts corresponding to the periphery of the photomask will become large. In contrast, when the center of the photomask protrudes upwardly (i.e., the photomask is deformed as a convex mirror), the exposure area of the part corresponding to the center of the photomask will become large, and the exposure area of the parts corresponding to the periphery of the photomask will become small. The differences in exposure areas indicates different light transmitting areas between the center and the periphery of the liquid crystal display panel, thus resulting in uneven brightness and poor display quality of the liquid crystal display panel. Similarly, for an array substrate, large difference in pattern dimensions is directly manifested in the non-uniform driving performance of TFTs (thin film transistors), thus causing poor display quality of the liquid crystal display panel.

SUMMARY OF THE INVENTION

To solve the technical problems in the prior art, the present disclosure provides a mask plate, which can compensate the effect of deformation of an exposure mask on the exposure area of the mask plate. The present disclosure also relates to a method for exposing the mask plate. The present disclosure further relates to a liquid crystal display panel including the mask plate.

(1) According to a first aspect of the present disclosure, a mask plate is provided. On the mask plate, a plurality of pattern regions is arranged such that of dimensions thereof changes in a gradient manner from the center to the edges of the mask plate.

According to the mask plate of the present disclosure, the changing dimensions of the pattern regions on the mask plate can compensate the optical path difference and the effect on the exposure area of the mask plate caused by the bending of the exposure mask, thus improving the display quality of the liquid crystal display panel including the mask plate according to the present disclosure.

(2) In an embodiment of (1) according to the present disclosure, the dimensions of the plurality of pattern regions are gradually increased or decreased from the center of the mask plate to the edges thereof. The gradual increase or decrease of the dimensions of the patterns from the center of the mask plate to the edges of the mask plate correspond to the different bending conditions of the exposure mask, thus effectively compensating the change in optical path from the exposure mask and the mask plate. In a preferred embodiment, the difference value between the dimensions of adjacent pattern regions ranges from 0.3 to 0.8 μm. In this case, the transition of the dimension change of the pattern regions is very smooth, thus improving the display quality of the liquid crystal panel.

(3) In one of the embodiments of (1) or (2) according to the present disclosure, the mask plate is a color filter plate, and the plurality of pattern regions are arranged within the display units of the color filter plate. In another embodiment, the mask plate is an array substrate, and the plurality of pattern regions are electrodes.

(4) According to a second aspect of the present disclosure, a liquid crystal panel comprising the mask plate according to any one of (1) to (3) of the present disclosure is provided.

(5) According to a third aspect of the present disclosure, a method for exposing the mask plate according to any one of (1) to (3) of the present disclosure is provided, comprising the following steps, (a) providing an exposure mask in a horizontal state, and measuring the deformation degree of the exposure mask;

(b) arranging, on the mask plate, a plurality of pattern regions, the dimensions of which change in a gradient manner from the center of the mask plate to the edges thereof according to the deformation degree of the exposure mask; and (c) completing the exposure of the mask plate.

According to the method of the present disclosure, the deformation degree of the exposure mask is measured immediately after the exposure mask is arranged, so that the dimensions of the pattern regions can be configured on the mask plate accordingly, thus the rejection rate during an initial production stage can be reduced. In addition, because the dimensions of the pattern regions are determined according to the deformation degree of the exposure mask, the effect of the deformation of the exposure mask on the exposure of the mask plate can be compensated to the largest extent.

(6) In an embodiment of (5) according to the present disclosure, in step (b), the difference value between the dimensions of the adjacent pattern regions matches with the difference value in optical paths from the exposure mask to the mask plate. In a specific embodiment, in step (b), when the center of the exposure mask is relatively distant from the mask plate and the edges of the exposure mask are close to the mask plate, the dimensions of the plurality of pattern regions are gradually decreased from the center of the mask plate to the edges thereof. In another embodiment, in step (b), when the center of the exposure mask is close to the mask plate and the edges of the exposure mask are relatively distant from the mask plate, the dimensions of the plurality of pattern regions are gradually increased from the center of the mask plate to the edges thereof. Such arrangement of the pattern regions tends to enable the dimensions of the pattern regions on the mask plate to be the same, thus improving the display quality of the liquid crystal panel.

(7) In one of the embodiments of to (5) or (6) according to the present disclosure, the difference value between the dimensions of adjacent pattern regions ranges from 0.3 to 0.8 µm. In this case, the transition of the dimension change of the pattern regions is very smooth, thus improving the display quality of the liquid crystal panel.

Compared with the prior art, the mask plate of the present disclosure has the following advantages. A plurality of pattern regions is arranged on the mask plate, and the dimensions of the plurality of pattern regions are changed in a gradient manner from the center of the mask plate to the edges thereof. This arrangement can compensate the optical path difference and the effect on the exposure area of the mask plate caused by the bending of the exposure mask, thus improving the display quality of the liquid crystal display panel including the mask plate according to the present disclosure. The difference value between the dimensions of adjacent pattern regions ranges from 0.3 to 0.8 µm, rendering the transition of dimension change of the pattern regions very smooth, so that the display quality of the liquid crystal display panel can also be improved. The method according to the present disclosure has the advantage that the deformation degree of the exposure mask is measured immediately after the exposure mask is arranged, so that the dimensions of the pattern regions on the mask plate can be configured accordingly, thus reducing the rejection rate during an initial production stage. In addition, the dimensions of the pattern regions are determined according to the deformation degree of the exposure mask, so that the effect of the deformation of the exposure mask on the exposure of the mask plate can be compensated to the largest extent. Therefore, the characteristics of the pattern regions on the mask plate tend to be the same, thus the display quality of the liquid crystal display panel can be improved.

BRIEF DESCRIPTION OF THE DRAWINGS

The present disclosure will be described in more detail below based on the embodiments with reference to the accompanying drawings, in which.

In the accompanying drawings, the same components are indicated by the same reference signs. The accompanying drawings are not drawn to actual scale.

DETAILED DESCRIPTION OF THE EMBODIMENTS

The present disclosure will be further illustrated below in conjunction with the accompanying drawings.

Figure 1:
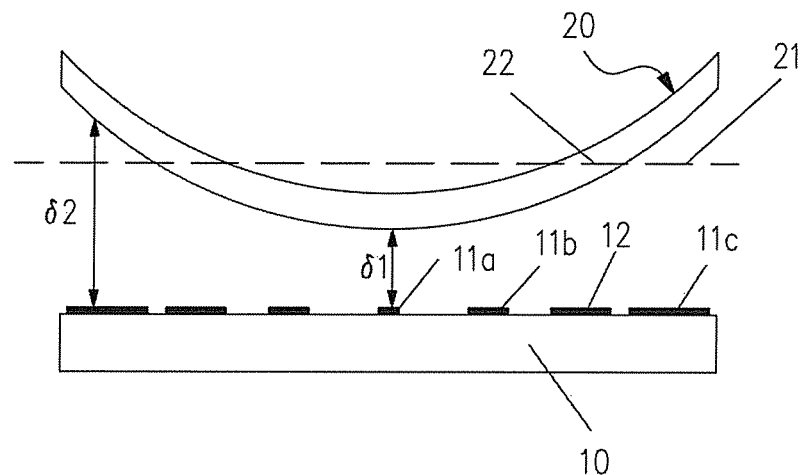
FIG. 1 and FIG. 2 schematically show the position relationship between a mask plate and an exposure mask according to the present disclosure.

FIG. 1 schematically shows the positional relationship between a mask plate 10 and a corresponding exposure mask 20 according to the present disclosure. It should be understood that FIG. 1 exaggeratedly shows the curvature of the exposure mask 20.

In the embodiment as shown in FIG. 1, the center of the exposure mask 20 is bent towards the mask plate 10 relative to a predetermined horizontal line 21 and is below the horizontal line 21, while the edges thereof are tilted away from the mask plate 10 and above the horizontal line 21. The exposure mask 20 forms a concave mirror as a whole. Because the mask plate 10 is horizontal, the optical path δ1 from the central region of the exposure mask 20 to the mask plate 10 is less than the optical path δ2 from the edges of the exposure mask 20 to the mask plate 10.

Figure 3:
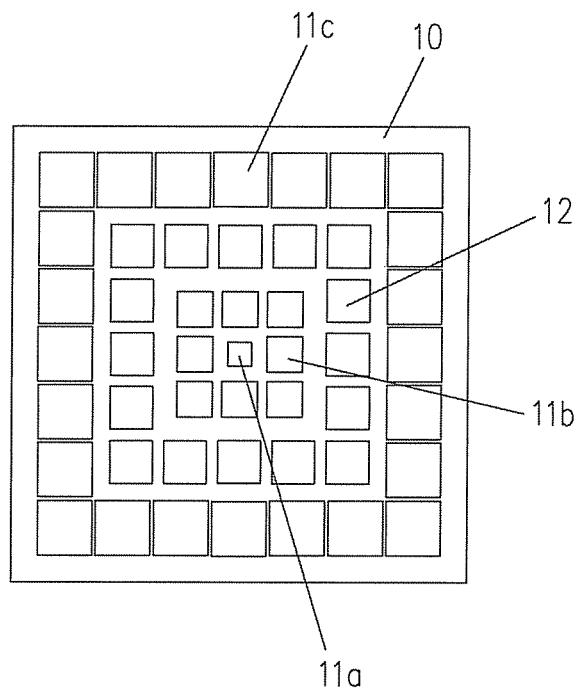
FIG. 3 schematically shows the pattern regions on the mask plate according to FIG. 1.

FIG. 3 schematically shows the pattern regions on the mask plate 10 in FIG. 1, such as 11a, 11b and 11c (only partly shown herein). As shown in FIG. 3, the dimension of the pattern region 11a at the center of the mask plate 10 is the smallest, the dimension of the pattern region 11b at the adjacent outer side of the pattern region 11a is larger than that of the pattern region 11a, and the dimension of the pattern region 11c at the further outer side is larger than the dimension of the pattern region 11b. The reason of such arrangement of the pattern regions on the mask plate 10 is that if a mask plate (in which the pattern regions arranged thereon are of the same dimension) in the prior art is used, the optical path δ1 will be smaller than the optical path δ2, thus causing the exposure area of the central part of the mask plate to be smaller than the exposure area of the edges thereof. The difference between the exposure areas can finally result in different light-transmitting areas between the center and the periphery of the liquid crystal display panel. According to the present disclosure, the arrangement of the pattern regions on the mask plate 10 follows the change of the exposure areas by providing pattern regions with small dimensions in the part with small exposure area, while pattern regions with large dimensions in the part with large exposure area. In this case, the light-transmitting areas between the center and the periphery of the liquid crystal display panel can be the same, and the brightness of the liquid crystal display panel is uniform, thus improving the display quality of the liquid crystal panel.

Because the exposure mask 20 passes through the predetermined horizontal line 21, there is actually an area with no deformation on the exposure mask 20. Usually, the non-deformed area forms a circle 22 with the center of the exposure mask 20 as the circle center. In this case, there certainly will be pattern regions 12 having the same dimension as the predetermined pattern regions on the mask plate 10, and moreover, the distribution of the pattern regions 12 corresponds to the circle 22. Thus, the dimensions of the pattern regions 11a and 11b at the inner part of the pattern regions 12 are smaller than the predetermined dimensions (i.e., the dimensions of the pattern regions 12), and the dimension of the pattern region 11c at the outer part of the pattern regions 12 is larger than the predetermined dimensions.

To obtain a more smooth display of the liquid crystal display panel, the difference value between the dimensions of adjacent pattern regions having different dimensions ranges from 0.3 to 0.8 µm. In this case, the transition of changes among the pattern regions with different dimensions is very smooth, thus improving the display quality of the liquid crystal display panel.

Figure 2:
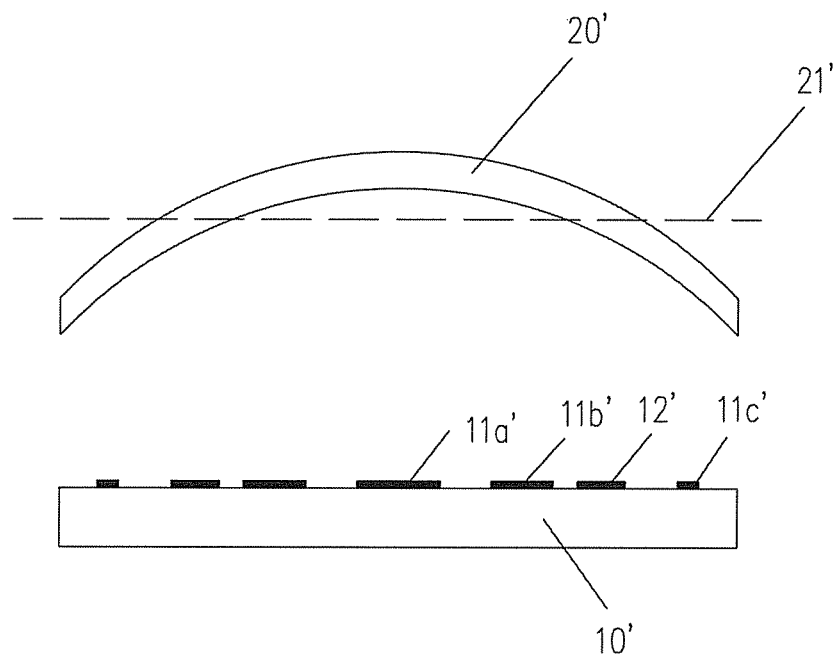
Figure 4:
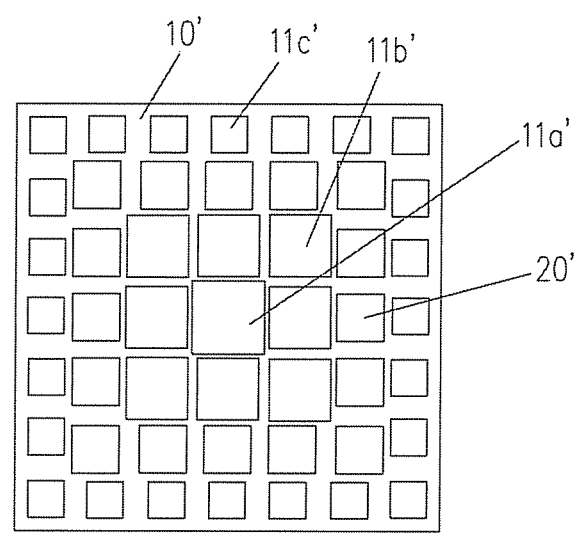
FIG. 4 schematically shows the pattern regions on the mask plate according to FIG. 2.

FIG. 2 schematically shows a similar positional relationship between the mask plate 10' and the corresponding exposure mask 20' as in FIG. 1. The difference between FIG. 2 and FIG. 1 only lies in that the exposure mask 20' is bent and forms the shape of a convex mirror, i.e., the center of the exposure mask 20' is bent away from the mask plate 10' relative to the predetermined horizontal line 21' and is above the horizontal line 21', and the edges tilt toward the mask plate 10' and below the horizontal line 21'. FIG. 4 schematically shows the mask plate 10' in FIG. 2. The dimensions of pattern regions 11a', 11b', and 11c' on the mask plate 10' are dimensions in FIG. 3 in reverse, i.e., the dimension of the pattern region 11a' at the center of the mask plate 10' is the largest, the dimension of the pattern region 11b' at the adjacent outer side of the pattern region 11a' is smaller than that of the pattern region 11a', and the dimension of the pattern region 11c' at further outer side is smaller than the dimension of the pattern region 11b'. Pattern regions 12' with predetermined dimensions are also provided. The reason of such arrangement is the same as in FIG. 3, which will not be described in detail herein.

The present disclosure further relates to a method for exposing the mask plate as shown in FIG. 3 and FIG. 4. The following is further description of the present disclosure with FIG. 3 as an example. At first, the exposure mask 20 is provided in a horizontal state, and the deformation degree thereof is measure immediately after the exposure mask is arranged. In this case, the dimensions of the pattern regions can be configured on the mask plate 10 accordingly, so that the rejection rate during an initial production stage can be reduced. Of course, the deformation degree of the exposure mask 20 can also be inferred from the exposure condition of the mask plate, instead of measuring the deformation degree of the exposure mask 20. However, this inferring method has many uncertainties and great probability to cause large quantity of low-quality products during the initial production stage. After that, a plurality of pattern regions is formed on the mask plate 10, and the plurality of pattern regions are arranged such that the dimensions thereof change in a gradient manner from the center of the mask plate 10 to the edges thereof, according to the deformation degree of the exposure mask 20. In the embodiments shown in FIG. 1 and FIG. 3, the dimensions of the plurality of pattern regions are gradually increasing from the center of the mask plate 10 to the edges of the mask plate 10. Finally, the mask plate 10 is exposed.

Because the deformation degree of the exposure mask will not change after the exposure mask is arranged, no additional steps or additional assemblies will be added to the exposure mask in the method according to the present disclosure. Therefore, the difficulty of the mask plate exposure process will not be increased, and the production cost will not be increased, either.

The present disclosure relates to a liquid crystal display panel (not shown) including the mask plate as shown in FIG. 3 or FIG. 4. In the liquid crystal display panel, the mask plate can be a color filter plate. The plurality of pattern regions are arranged within the display units of the color filter plate. The mask plate can also be an array substrate, and the plurality of pattern regions are electrodes.

Although the present disclosure has been described with reference to preferred embodiments, various modifications could be made to the present disclosure without departing from the scope of the present disclosure and components in the present disclosure could be substituted by equivalents. Particularly, as long as there is no structural conflict, all technical features mentioned in all the embodiments may be combined together in any manner. The present disclosure is not limited to the specific embodiments disclosed in the description, but includes all technical solutions falling into the scope of the claims.

The invention claimed is:

1. A mask plate, on which a plurality of pattern regions is arranged such that the dimensions thereof change in a gradient manner from the center to the edges of the mask plate,
   wherein the dimensions of the plurality of pattern regions are gradually increased from the center of the mask plate to the edges thereof,
   wherein the difference value between the dimensions of adjacent pattern regions ranges from 0.3 to 0.8 µm.

2. The mask plate according to claim 1, wherein the mask plate is a color filter plate or an array substrate;
   when the mask plate is a color filter plate, the plurality of pattern regions are arranged within the display units of the color filter plate; and
   when the mask plate is an array substrate, the plurality of pattern regions are electrodes.

3. A liquid crystal display panel including a mask plate, on which a plurality of pattern regions is arranged such that the dimensions thereof change in a gradient manner from the center to the edges of the mask plate;
   the mask plate is a color filter plate or an array substrate;
   when the mask plate is a color filter plate, the plurality of pattern regions are arranged within the display units of the color filter plate; and
   when the mask plate is an array substrate, the plurality of pattern regions are electrodes,
   wherein the dimensions of the plurality of pattern regions are gradually increased from the center of the mask plate to the edges thereof,
   wherein the difference value between the dimensions of adjacent pattern regions ranges from 0.3 to 0.8 µm.

4. A method for exposing a mask plate, on which a plurality of pattern regions is arranged such that the dimensions thereof change in a gradient manner from the center to the edges of the mask plate;
   wherein the method comprises the steps of:
   (a) providing an exposure mask in a horizontal state, and measuring the deformation degree of the exposure mask;
   (b) arranging, on the mask plate, a plurality of pattern regions, the dimensions of which change in a gradient manner from the center of the mask plate to the edges thereof according to the deformation degree of the exposure mask, the dimensions of the plurality of pattern regions being gradually increased from the center of the mask plate to the edges thereof, the difference value between the dimensions of the adjacent pattern regions being in a range from 0.3 to 0.8µm; and
   (c) completing the exposure of the mask plate.

5. The method according to claim 4, wherein in step (b), the difference value between the dimensions of the adjacent pattern regions matches with the difference value in optical paths from the exposure mask to the mask plate.

6. The method according to claim 5, wherein in step (b), the center of the exposure mask is relatively distant from the mask plate and the edges of the exposure mask are close to the mask plate.

7. The method according to claim 5, wherein in step (b), the center of the exposure mask is close to the mask plate and the edges of the exposure mask are relatively distant from the mask plate.

\* \* \* \* \*